United States Patent [19]

Wilent et al.

[11] Patent Number: 4,790,694
[45] Date of Patent: Dec. 13, 1988

[54] METHOD AND SYSTEM FOR MULTI-LAYER PRINTED CIRCUIT BOARD PRE-DRILL PROCESSING

[75] Inventors: John W. Wilent; Robert F. Benson, both of San Jose; Robert A. Sparks, Palo Alto, all of Calif.

[73] Assignee: Loma Park Associates, Campbell, Calif.

[21] Appl. No.: 916,779

[22] Filed: Oct. 9, 1986

[51] Int. Cl.$^4$ .............................................. B23C 3/00
[52] U.S. Cl. .................................... 408/1 R; 83/71; 408/3; 408/16
[58] Field of Search ............... 408/1 R, 3, 72 R, 75, 408/16; 250/491.1; 29/720, 721; 83/71; 234/2

[56] References Cited

U.S. PATENT DOCUMENTS

| | | | |
|---|---|---|---|
| 3,447,924 | 6/1969 | Trzyna | 430/323 |
| 3,573,455 | 9/1968 | Suierveld | 250/65 |
| 3,663,114 | 5/1972 | Welsh et al. | 408/3 |
| 4,176,281 | 11/1979 | Tischer et al. | 250/492 A |
| 4,280,775 | 7/1981 | Wood | 408/3 |
| 4,361,634 | 11/1982 | Miller | 430/5 |
| 4,708,545 | 11/1987 | Fujii et al. | 408/1 R |

*Primary Examiner*—Neil Abrams
*Attorney, Agent, or Firm*—Townsend & Townsend

[57] ABSTRACT

A method and apparatus for optimizing the drilling position of a multi-layer printed circuit board prior to drilling. A template having precisely located target holes and fixture reference marks provides initial coordinate reference information for multi-layer printed circuit boards to be inspected by x radiation. Each board is processed by insertion into a holding fixture, examination of four quadrant target areas using x-ray sources and detectors, digitization of the target area images in each quadrant, and computaton of the optimum board position in a follow-on drilling apparatus. After optimization, three reference holes are punched along one edge of the board to provide accurate fiducial positioning marks when the board is placed in the drilling apparatus.

13 Claims, 5 Drawing Sheets

U.S. Patent  Dec. 13, 1988  Sheet 1 of 5  4,790,694
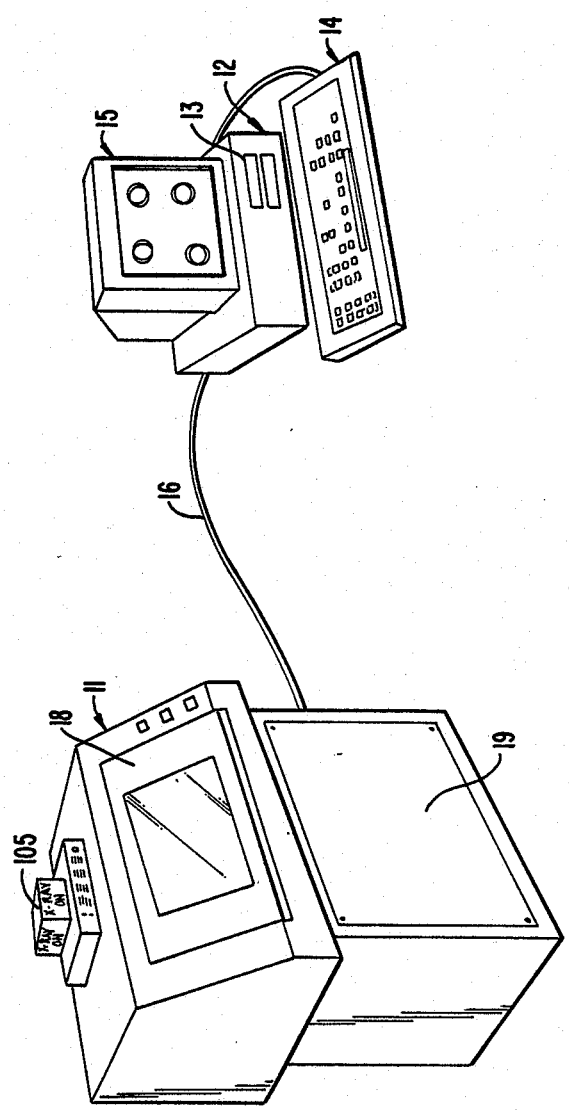
FIG._1.
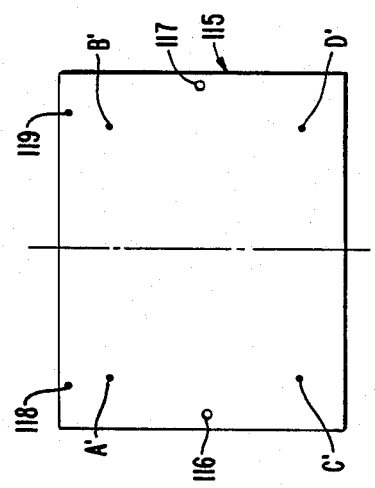
FIG._8.

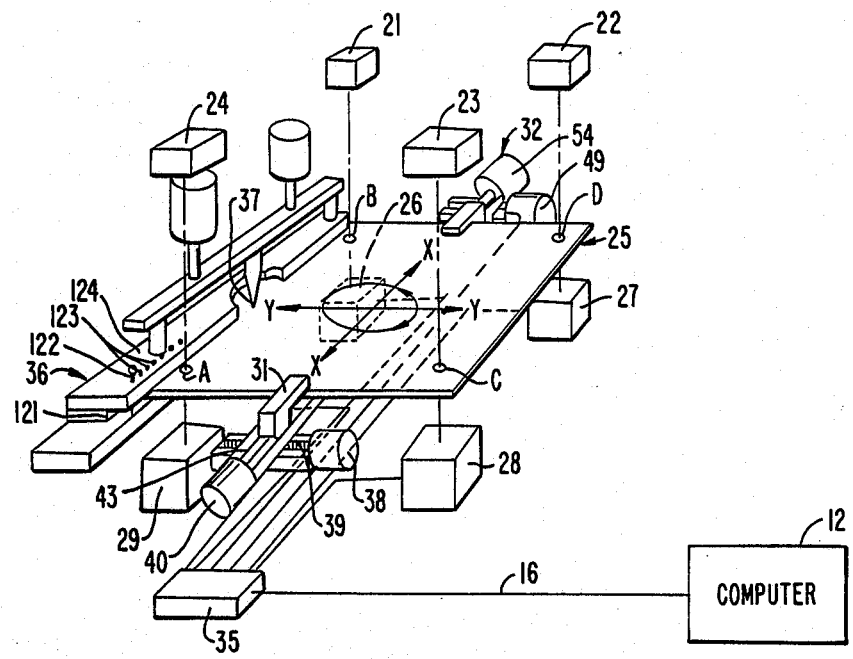
FIG._2.
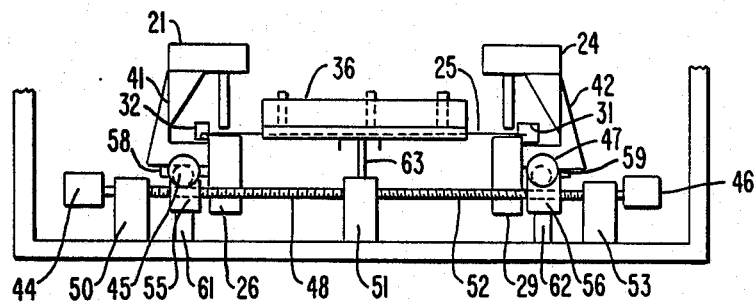
FIG._3.

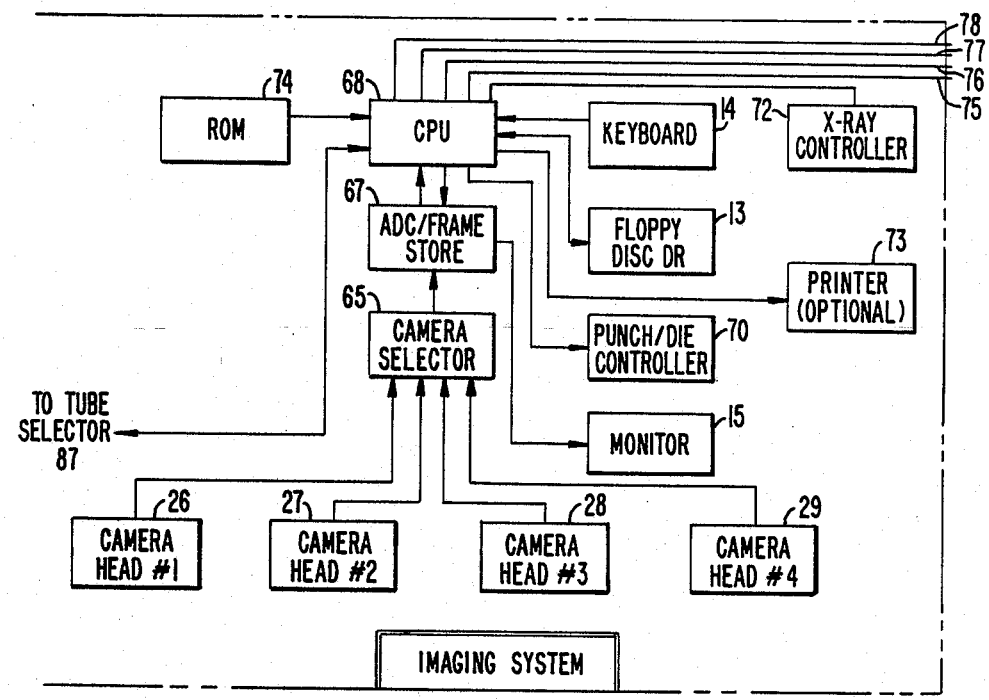
FIG._4.
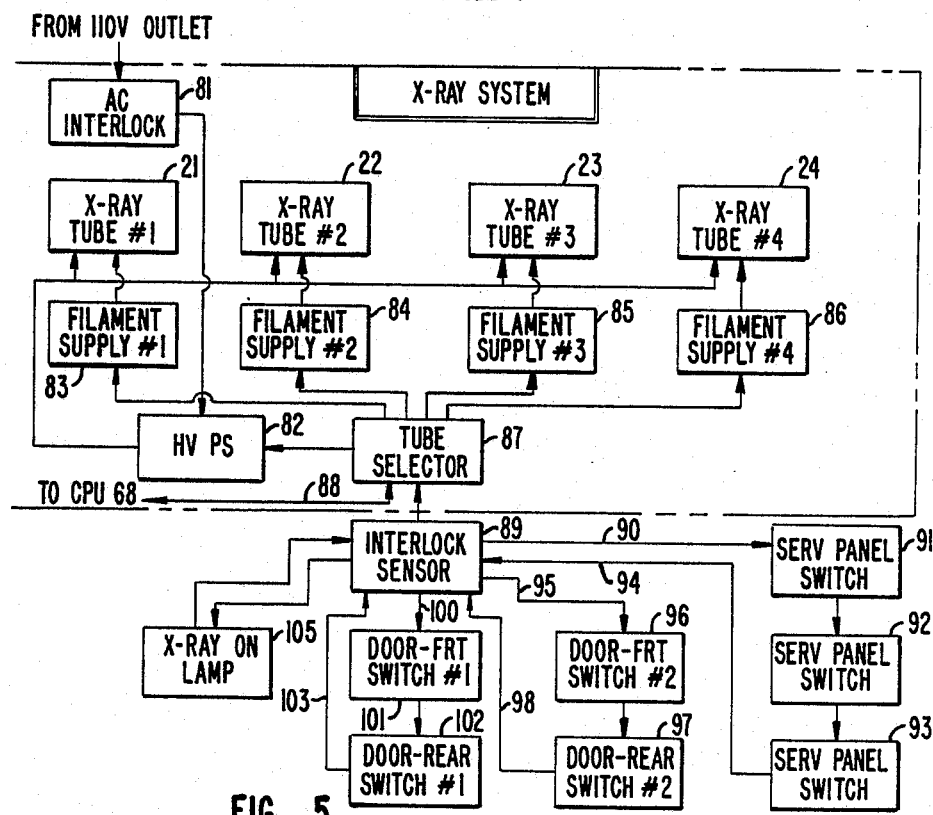
FIG._5.

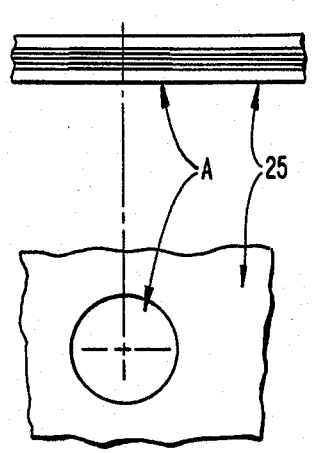
FIG._6.
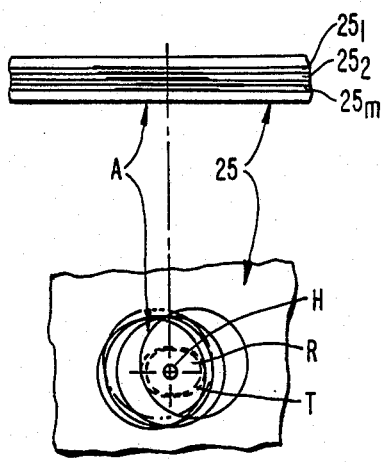
FIG._7.
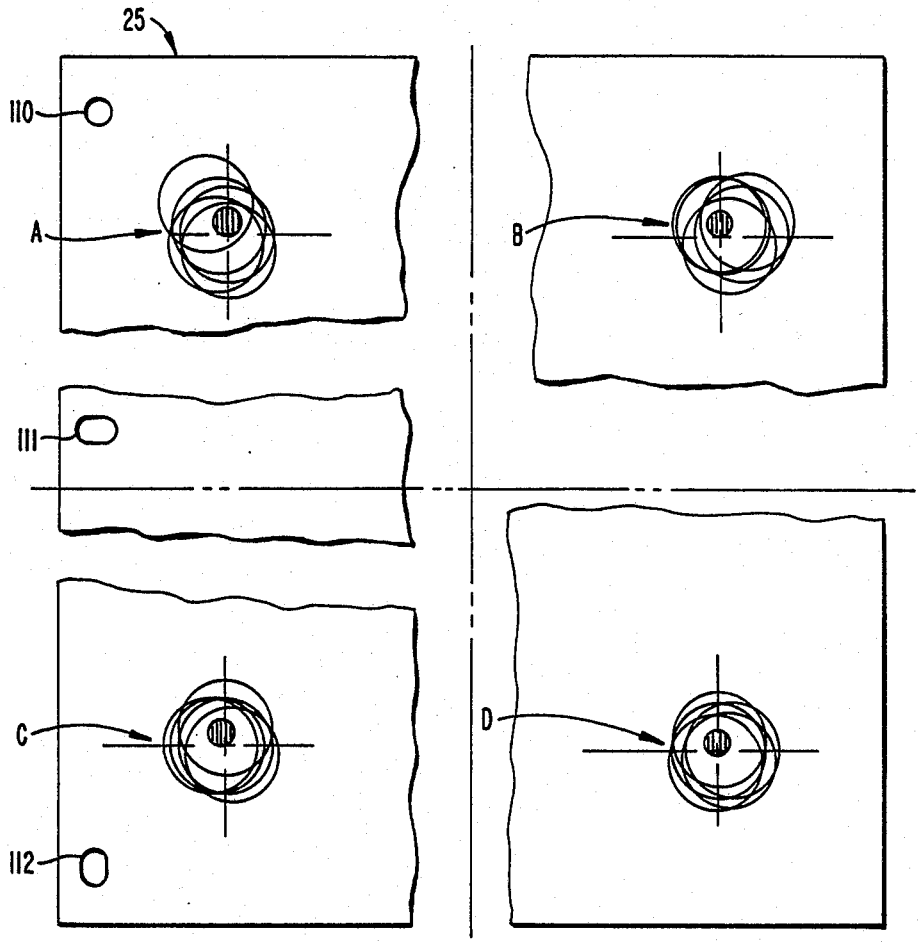
FIG._9.

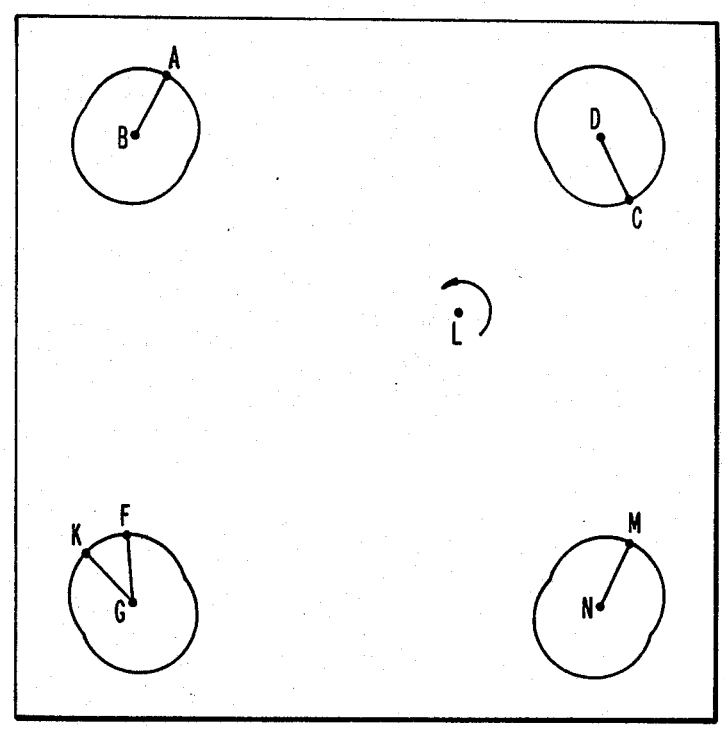
FIG._10.
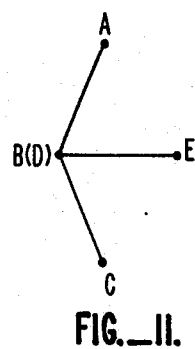
FIG._11.
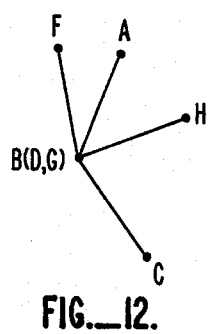
FIG._12.
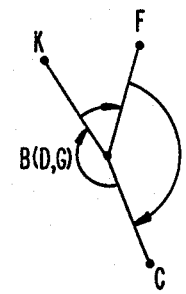
FIG._13.

METHOD AND SYSTEM FOR MULTI-LAYER PRINTED CIRCUIT BOARD PRE-DRILL PROCESSING

BACKGROUND OF THE INVENTION

This invention relates to the field of multi-layer printed circuit board preparation. More particularly, this invention relates to processing of a multi-layer circuit board after lamination and prior to drilling.

Multi-layer printed circuit boards have found increasing use in the manufacture of electronic products. A typical multi-layer circuit board comprises a plurality of individual circuit boards laminated together. Each printed circuit board comprises an electrically non-conductive substrate material having conductive patterns formed on one or both sides thereof. The conductive patterns are used to provide interconnect paths among the active and passive electronic components eventually mounted on the multi-layer printed circuit board. In order to afford proper connections, predetermined points on the conductive paths on different individual boards must be interconnected, and these interconnections are typically made by drilling holes through the board at precise locations, followed by plating the through-holes with an electrically conductive material such as solder. Since there are literally hundreds of such holes to be drilled in a typical multi-layer board, the drilling is typically done in an automatic drilling apparatus controlled by a computer program. A typical drilling apparatus used for this purpose has multiple drill spindles which are independently activated by the master program in order to reduce the total drilling time required to form the multiple holes on a single multi-layer board. In order to properly position the multi-layer board initially in the drilling apparatus, some fixed referencing arrangement is usually employed, such as registration holes formed in edge portions of the board which mate with pins carried by the drilling apparatus table.

A severe problem encountered in the multi-layer board fabrication art is that of misregistration among the individual boards comprising the assembly. While the individual board patterns can be formed very precisely using conventional photolithography, exact registration among the multiple patterns on the several boards is impossible to achieve due to distortions introduced during the lamination processing. These distortions typically lead to maximum misregistration at the outer edges of the panels. The principal criterion for a useful board can be simply stated: each hole drilled through the multi-layer board must be surrounded by a conductive material at each layer in order to form a useful hole. Due, however, to the misregistration introduced during the lamination process, this criterion cannot be met by all multi-layer boards. In fact, the rejection rate for multi-layer boards has a present practical range of from 5% to 20%, depending upon the minimum pattern line width, maximum acceptable hole diameter, and pattern complexity.

In the past, attempts at quality control for multi-layer circuit boards have centered about an inspection process wherein the developing multi-layer board is photographed at preselected stages of the fabrication process using an x-radiation source and x-radiation sensitive film. After the films are developed, the successive photographs are compared to discern the degree of misregistration or distortion introduced during the intervening steps between the preselected stages. Once the final multi-layer assembly is completed, and before the board is subjected to programmed drilling, a final comparison is made and the board is either accepted or rejected for drilling based upon this final comparison. Although useful, this process is slow and cumbersome and can only be effectively employed to sample representative multi-layer boards with theoretically identical patterns, which are undergoing multi-layer lamination. Since this technique is only amenable to spot sampling in a production environment, many multi-layer boards which should be rejected for misregistration or deformation are passed on to the automatic drilling station, where they are uselessly drilled and ultimately scrapped. The automated drilling of a board which does not meet the minimum registration requirements is extremely wasteful, since it results in a product which cannot be used. With relatively dense boards, thousands of holes are actually drilled, which consumes relatively large periods of the drilling machine time. For example, in an 18 inch ×24 inch multi-layer board, the number of holes typically ranges from 12,000 to 14,000, and the complete drilling of such a board can take as long as 90 minutes. As a result, the x-ray film inspection process has not been found to be a satisfactory solution to the problem of effective quality control for multi-layer boards prior to drilling.

In an effort to avoid the disadvantages with the x-radiation photographic process, a system has been developed to permit on-line inspection of multi-layer boards using an x-ray imaging system which examines test holes formed near the corners of the individual board layers and displays the percent of registration among all corresponding holes in a given corner region. While useful, this system is very large and expensive, and merely provides a percent registration figure for each set of test holes on a sequential basis. If a given multi-layer board falls within the permitted percentage of misregistration, it will be passed on for drilling. For those accepted boards which are close to the maximum permitted percentage misregistration, the accumulation of tolerance errors inherent in the drilling machine can result in a multi-layer board with unacceptable through holes.

SUMMARY OF THE INVENTION

The invention comprises a method and system for processing multi-layer printed circuit boards for acceptability prior to the automatic drilling process which automatically determines the degree of misregistration of individual board layers, calculates whether the board lies within the tolerance limits, and provides reference indicia on the board which specify to the follow-on automatic drilling machine the optimum position of that board for the drilling program to be executed.

From a process standpoint, the invention comprises a method of preparing a multi-layer printed circuit board for automatic drilling in a drilling apparatus, the board comprising a laminated stack of individual boards each having a plurality of target areas located at predetermined locations thereon so that corresponding target areas on different individual boards overlap, the method including the steps of positioning the multi-layer board in an inspection fixture, examining the target areas with a radiation source and a detector, comparing the locations of the target areas with predetermined location coordinates, and marking the multi-layer board with reference indicia providing optimum positioning for the multi-layer board in the drilling apparatus. The step of comparing locations is preferably performed with predetermined location coordinates obtained by centering a master template having the target areas in the inspection fixture, and storing the location coordinates of the master template target areas. The step of marking preferably includes the step of forming apertures in preselected regions of the multi-layer board, preferably along one edge portion of the multi-layer board.

The step of marking the multi-layer board further preferably includes the step of calculating those orthogonal position coordinates for the multi-layer board which result in circumscription of a minimum drilling area by overlapping target areas.

From an apparatus standpoint, the invention comprises a system for enabling the preparation of a multi-layer printed circuit board for automatic drilling in a drilling apparatus, the board comprising a laminated stack of individual boards each having a plurality of target areas located at predetermined locations thereof so that corresponding target areas on different individual boards overlap, the system comprising positioning means for movably supporting a multi-layer board, means for examining the target areas on a multi-layer board when located on the positioning means, memory means for storing predetermined location coordinates, means for comparing the locations of the target areas with the predetermined location coordinates, means for enabling the positioning means to locate a multi-layer board in an optimum position wherein overlapping target areas circumscribe the predetermined location coordinates with a minimum drilling area, and means for marking a multi-layer board with reference indicia indicating the optimum position.

The marking means preferably includes means for forming apertures in preselected regions of the multi-layer board, preferably along one edge portion of the board.

The enabling means preferably includes means for calculating the amount of movement of the multi-layer board required to provide the optimum position.

The examining means preferably includes at least one radiation source and a plurality of radiation detectors. The preferred embodiment employs a plurality of radiation sources and a corresponding plurality of radiation detectors, which are preferably x-radiation devices.

The system also includes means for determining that a given multi-layer board cannot be located in the optimum position.

An important aspect of the invention from both a method and system standpoint is the use of a template to provide the predetermined location coordinates necessary to inspection and judgment of the acceptability of each individual multi-layer board. The master template is preferably prepared by positioning the template in a board drilling apparatus, drilling target holes at preselected positions in the template corresponding to positions of target regions on the printed circuit board, and forming fixture reference marks in the template, preferably along one edge portion of the template.

The invention enables individual multi-layer boards to be inspected in a production line environment for acceptability in a relatively short period of time. By examining each multi-layer board on a individual basis prior to drilling, any board which does not meet the registration criteria can be rejected before drilling, which saves substantial portions of useless drilling time.

In addition, boards which might be considered to be marginally acceptable if examined on a visual basis can be saved using the method and system of the invention, which reduces the scrap rate and thus improves the efficiency of the overall board fabrication process. Moreover, since the template is prepared on the same drilling machine used to actually drill the multi-layer boards, any positioning inaccuracies inherent in the drilling machine are incorporated into the template, which removes drilling machine positional inaccuracies as a possible source of errors in the board positioning process.

For a fuller understanding of the nature and advantages of the invention, reference should be had to the ensuing detailed description taken in conjunction with the accompanying drawings.

BRIEF DESCRIPTION OF THE DRAWINGS

FIG. 1 is a perspective view of a system embodying the invention;

FIG. 2 is a schematic view showing a portion of the system of FIG. 1;

FIG. 3 is a schematic and elevational view illustrating portions of the x-ray and translation elements of the system of FIG. 1;

FIG. 4 is a block diagram showing the electronic control elements of the system;

FIG. 5 is a block diagram illustrating the x-ray portion of the system;

FIG. 6 is a compound view illustrating a portion of a multi-layer printed circuit board with perfect registration among layers;

FIG. 7 is a view similar to FIG. 6 illustrating a portion of a multi-layer printed circuit board with typical misregistration between layers;

FIG. 8 is a plan view of the template used to initialize the system of FIG. 1; and FIG. 9 is a partial plan view of a multi-layer printed circuit board after repositioning to establish the optimum position of the board for drilling;

FIG. 10 is a schematic view of a z-layer board with misaligned target areas; and FIGS. 11–13 are vector diagrams illustrating the method of optimizing the position of the FIG. 10 board.

DESCRIPTION OF THE PREFERRED EMBODIMENT

Turning now to the drawings, FIG. 1 illustrates a system embodying the invention. As seen in this Fig., a cabinet 11 houses the x-ray portions of the system to be described, as well as the mechanical elements described below used to position a master template and multi-layer printed circuit boards in the manner described below. A computer 12 having an associated disk drive 13, a keyboard 14, and a CRT monitor 15 is coupled to the electrical components within cabinet 11 by means of multi-conductor cable 16. Cabinet 11 is provided with a front access door 18 to enable loading and unloading of the master template and the printed circuit boards; a front service panel 19, and a corresponding rear service panel, (not illustrated) for facilitating installation and servicing of the units within cabinet 11.

FIG. 2 is a schematic diagram illustrating the major x-radiation components of the system located within cabinet 11 and a portion of the electromechanical components of the system. As seen in this Fig., four sources of x-radiation 21–24 are positioned above a multi-layer printed circuit board generally designated by reference numeral 25 adjacent the four corner regions thereof. A corresponding number of x-radiation detectors 26–29 are positioned below the board 25 in corresponding corner locations so that the x-radiation from an associated source 21–24 impinges upon the radiation sensitive portion of the corresponding detector 26–29. A pair of electrically operable holding clamps 31, 32 are positioned to firmly grasp the board 25 at opposing edges at the mid-point thereof. A controller 35 receives commands from computer 12 via cable 16 and controls the operation of the sources 21–24, detectors 26–29 and clamps 31, 32.

A mechanical punch assembly 36 is provided to form through holes in the board 25 after positioning in the manner described below, in order to provide reference indicia on the board 25 for locating the board in the follow-on drilling apparatus. Punch assembly 36 is preferably a pneumatically operated device having a plurality (13) of interchangeable punch positions, with an off-center punch position 37 to provide proper orientation of a panel punched in the manner described below.

As best shown in FIG. 3, which is a detailed supplementary view taken from the punch end of the FIG. 2 apparatus, each source/detector pair is mounted on an independent carrier, such as carrier 41 for source 21/detector 26 and carrier 42 for source 24/detector 29 so that the relative positions of each source and detector are fixed. Each carrier is mounted for movement independently in two orthogonal directions so that the individual source/detector pairs can be individually positioned with respect to reference coordinates after insertion of the board 25 into the apparatus. Thus, carrier 41 is operatively connected to a pair of driving motors 44, 45; while carrier 42 is operatively connected to a pair of driving motors 46, 47. Motors 45, 47 provide bi-directional translation along the x direction; while motors 44, 46 provide bi-directional translation along the orthogonal Y direction. Motor 44, for example drives a threaded shaft 48 journalled in a pair of bearing blocks 50, 51; while motor 46 drives a threaded shaft 52 journalled in bearing block 51 and additional bearing block 53. X motor 45 is mounted on an internally threaded follower 55 received on threaded shaft 48; while X motor 47 is mounted on an internally threaded follower 56 received on threaded shaft 52. When Y motor 44 is operated in a first direction of rotation, follower 55 is translated to the right as viewed in FIG. 3, while operation of Y motor 44 in the opposite rotational direction results in translation of follower 55 to the left as viewed in FIG. 3. Follower 56 responds to an identical fashion to the operation of motor Y 46.

The mechanical elements used to provide bi-directional translation of carrier elements 41, 42 in response to operation of X motors 45, 47 are identical to those described for elements 44, 46, 48, 52, 55 and 56, and thus are not illustrated in detail. Briefly, carriers 41, 42 are mounted on followers 58, 59 each having an internally threaded bore received on a screw shaft (not illustrated) connected at one end to the driving motor 45, 47 and journalled at the other end in bearing blocks 61, 62.

As also seen in FIG. 3, punch assembly 36 is supported in a fixed position by a suitable referencing member, such as link 63 secured to bearing block 51.

With reference to FIG. 2, clamps 31, 32 are similarly mounted for translation along orthogonal directions by means of suitable motors, bearing blocks, and screw shafts in a manner identical to that provided for the carriers 41, 42 so that each clamp 31, 32 can be independently translated in response to commands from computer 12. For example, clamp 31 is driven in the Y direction by motor 38 and screw shaft 39 journalled in a bearing block (not illustrated). Clamp 32 is provided with a Y-motor 49 and a X-motor 54 and associated screw shafts and threaded members (not illustrated).

FIG. 4 illustrates the major units for the imaging system portion of the preferred embodiment. As best seen in this Fig., the four x-radiation detectors 26–29, which are identified as camera heads, are coupled to a camera selector 65, which functions to switch the signal output from each of the detectors 26–29 to a combined analog-to-digital converter and frame store unit 67. Unit 67 functions to convert the analog image signal supplied from the detectors 26–29 to digital form and to store the digital image signals. Unit 67 is under control of a central processor unit 68 capable of reading the image signals from the frame store portion of unit 67 for image processing and directing the images stored in unit 67 to be displayed on monitor 15.

The CPU 68 also controls a punch/die controller unit 70 used to operate punch assembly 36; the floppy disk drive 13; an x-ray controller 72; and an optional printer 73. CPU 68 also receives input data and status and control commands from keyboard 14. The operating program for CPU 68 is stored in a ROM 74. CPU 68 further generates motor control commands for the X and Y drive motors used to position the x-radiation source/detector pairs (such as motors 45, 45, 46 and 47 used to control the position of carriers 41, 42) and the X and Y drive motors for clamps 31, 32 on control output lines 75–78.

FIG. 5 illustrates the major units comprising the x-ray system used in the preferred embodiment. As seen in this Fig., power from a 110 volt AC source is coupled via an AC interlock unit 81 to a high voltage power supply unit 82 used to supply power to the four radiation sources 21–24 identified in FIG. 5 as x-ray tubes. Each x-radiation source is provided with a separate filament supply 83, 84, 85 and 86, which are controlled by a tube selector unit 87.

Tube selector unit 87 is controlled by signals supplied from CPU 68 via cable 88, and is also subject to an enabling signal generated by an interlock sensor unit 89. Interlock sensor unit 89 generates interrogating signals on a first interrogation line 90 which are serially connected through three service panel switches 91–93, which sense the position of all service panels (such as panel 19) and which return an enabling signal along conductor 94 only when all switches indicate that all service panels are closed. Similarly, interlock sensor 89 generates interrogating signals on a conductor 95 which are serially connected through a first pair of door switches 96, 97, and which return an enabling signal on conductor 98 when the switches indicate that the first pair of switches on the front and rear doors are closed. In addition, third interrogating signals are generated on conductor 100 by interlock sensor 89 which interrogate a separate pair of switches on front door 18 and the rear door, and which return an enabling signal on conductor 103 when these switches are closed. In addition, interlock sensor 89 generates an enabling signal for a warning lamp 105 which signifies to the operator that the x-ray system has been activated.

The above-described system elements are designed to process multi-layer printed circuit boards on a production line basis for acceptability prior to the automatic drilling process in order to determine which boards comply with the tolerance requirement for drilling, and to mark each individual acceptable board using the punch assembly 36 with the reference indicia which will enable the board to be located on the drilling apparatus platform in the optimum drilling location. To facilitate the process, each multi-layer board is provided with four target areas generally designated with reference letters A,B, C and D (FIG. 2) located near the outer corners, which are subjected to automatic x-ray examination by sources 21-24 and detectors 26-29. The target areas should all be the same size and shape, and should all be located in the same position on each individual board layer. The target areas may be dedicated separate areas or may comprise a set of existing pads forming part of the circuitry artwork.

FIG. 6 illustrates a section of a multi-layer board 25 in which the individual layers of the board are ideally perfectly aligned. The upper portion of FIG. 6 is a partial sectional view of the region surrounding and including target area A, while the lower portion is a plan view of that same region. As seen in this Fig., x-ray inspection of the target area A by source 21 and detector 26 will produce image data reflecting the fact that the target areas in each layer of board 25 (shown as the shaded region in the upper portion of the Fig.) are perfectly aligned. FIG. 7 illustrates the same region of a multi-layer board 25 in which the target areas in the individual layers $25_1$-$25_n$ are mis-aligned, which is the usual condition of a multi-layer board after the lamination process has been completed. As seen in this Fig., inspection of the target area A will produce image data representative of the actual amount of mis-alignment among the several target areas in the multi-layer board 25. It should be noted that the target area images illustrated in FIGS. 6 and 7 are converted to digital data and stored in the ADC/frame store unit 67 (FIG. 4). In addition, the image of each target area A-D is preferably displayed on monitor 12 for visual inspection by the operator of the system.

Once the imaging data has been obtained, it is examined and processed by the CPU 68 under control of ROM 74 to initially determine whether a closed boundary can be generated in the central intersection region R, which will provide a drilling region sufficiently large to permit the drill to pass through the target region of each layer while leaving sufficient target metal surrounding the hole to be formed to meet the minimum surplus tolerance. In FIG. 7, the hole size required by the drill is designated by the circle labelled with the reference letter H, while the closed boundary for the mis-registration condition shown in FIG. 7 is designated with the letter T. Thus, for the mis-registration example of FIG. 7 it is evident that the mis-registration of the target areas falls within the acceptable limits since the boundary T encompasses the hole region H with adequate surplus metal (the annulus between T and H). Once the boundary computation T has been made for each of the four target areas A-D, the coordinate center of each boundary region T is compared with the reference coordinates of ideal target regions obtained from the template shown in FIG. 8. Thereafter, CPU 68 computes four sets of location coordinates for target areas A-D, if possible, which will result in relative location of each of the four target areas A-D such that a drill passing through each of the boundary regions T can produce a hole surrounded by target area metal lying within the tolerance standard. If such a set of coordinates can be found, the motors used to position the panel clamps 31, 32 are energized to maneuver the board 25 to that optimum position. Thereafter, the punch assembly 36 is energized by CPU 68 to punch three reference holes 110, 111 and 112 shown in FIG. 9 which function as locating indicia or fiducial marks for that particular board. The drilling apparatus has a corresponding set of fixed location pins onto which the fiducial marks 110-112 can be maneuvered just prior to drilling. If a set of coordinates cannot be found, the board 25 is then rejected or subjected to further analysis by the operator in the manner described below.

FIG. 8 illustrates a master template used to provide the reference coordinate information during initial setup of the system. As seen in this Fig., a template 115 having the same dimension as a multi-layer board to be processed and fabricated from stainless steel, copper clad epoxy-fiberglass or any other dimensionally stable x-ray absorbent material is provided with a pair of set up holes 118, 119 along the rear edge thereof, and four target holes A', B', C' and D'. The set up holes 118, 119 are formed in the template 115 on the associated drilling apparatus to precise dimensions and in precise locations. In the preferred embodiment, the set up holes 118, 119 have a diameter of 0.1875 in. with a center-to-center dimension matched to the centers of the punch positions in punch assembly 36. Similarly, the target holes A', B', C' and D' are formed in template 115 on the associated drilling apparatus, with the exact size of the holes A', B', C' and D' being equal to the size of the target regions formed on the multi-layer board 25. The template is inserted into the apparatus shown in FIGS. 2 and 3 using reference pins through set up holes 118, 119 to locate the template initially with respect to the punch assembly 36 punch positions.

The setup procedure progresses in the following fashion.

The operator, using keyboard 14 enters the date, part no. and revision level information, followed by the diameter of the holes to be drilled in a given board 25, the diameter of the target area and the minimum clearance between the outer edge of the hole H and the surrounding metal. Next, the template 115 is inserted into the system, and setup pins are placed through the punch assembly holes 37 and the set-up holes 118, 119. Next, the clamps 31, 32 are activated to grasp the template.

With the template secured in the proper reference position (provided by the pins through the set-up holes 118, 119), the operator then enters the appropriate commands to permit manual translation of the four sets of source/detector pairs approximately over the respective target holes A', B', C' and D'. In the specific embodiment this is done by manipulating the M key, followed by the numeral 1 key, which enables manual control of the source 21/detector 26 pair, followed by manipulation of the arrow keys on the keyboard 14 to translate the source 21/detector 26 to a position directly over target hole A', after which the operator presses the enter key to record the approximate coordinate position, This is followed by pressing the numeral 2 key, which enables manual control of the source 22/detector 27 pair, manipulation of arrow keys to translate this pair over the reference hole B', and actuation of the enter key to record the coordinate position of source 22/detector 27. This is repeated for the third and fourth source/detector pairs 24, 29 and 23, 28, respectively.

After all four source/detector pairs have been approximately centered over the respective target holes A'-D', the panel clamps 31, 32 are positioned with respect to the opposing edges of the template 115 by keyboard entry of appropriate commands by the operator. In the specific embodiment, the operator first actuates the C key, which enables manual control for the panel clamps 31, 32, followed by actuation of the L key, which enables manual control for the left hand panel clamp 31. Thereafter, the left hand panel clamp 31 is manually positioned with respect to the template 115, after which the enter key is actuated to record the x-y positions of this panel clamp. This is followed by the actuation of the R key to enable manual control of the right hand panel clamp 32, followed by manual positioning of clamp 32 and activation of the enter key, to record the x-y positions of this panel clamp.

After both panel clamps have been properly positioned, the P key is actuated, which enables both panel clamps 31, 32 to grasp the template 115, and the CPU 68 directs the panel clamp motors to move the template 115 away from the punch assembly 36 by a predetermined incremental amount in the both the x and y directions. Next, front door 18 is closed, which conditions the system for activation of the x-ray operation.

Activation of the x-ray system commences with the activation of an X-RAY ON button which causes power to be applied to the high voltage power supply 82 and thus the four x-ray sources 21-24. In addition, the CPU 68 enables the tube selector 87 to activate the filament supplies 83-86, provided that the interlock sensor unit 89 has determined that all service panels and doors are closed to enable the tube selector unit 87. The operator next adjusts a high voltage and a power control while viewing the image on the monitor 15 to adjust the image quality to obtain the sharpest image of the target holes A'-D'. Once a satisfactory image is obtained, the operator activates a control and an x key to automatically record the voltage and current settings, followed by the actuation of the enter key. The system is now ready for automatic centering of the four source/detector pairs exactly over the target holes.

The operator commences automatic centering by activating the A key, which activates an automatic imaging system centering routine, followed by activation of the numeral 1 key, which causes the system to automatically center the source 21/detector 26 pair over target hole A'. Once the automatic centering process is complete, the x and y coordinates for target hole A', which are displayed on the monitor 15 during the centering process, indicate +0.000. When this occurs, the operator activates the enter key, which causes the location coordinates of target hole A' to be stored in memory by CPU 68. The process is repeated for the other three remaining source/detector pairs by sequentially operating the numeral 2 and enter keys, numeral 3 and enter keys and numeral 4 and enter keys. After the last source/detector pair has been centered and its location coordinates stored in memory, the initial setup procedure is completed.

Preferably, the accuracy of the initial setup is checked once by removing the template 115 from the unit, reinstalling the template in the punch assembly 36, closing all service panels and access doors, activating the x-ray system, and checking the visible display of the x-y coordinates on monitor 15, which should all read +0.000. If the setup test does not result in a display of all zeros for the four test hole coordinates, the initial setup procedure is repeated.

Once the reference coordinates for test holes A'-D' have been thus entered into the system using the setup procedure with the template 115, the system is now ready for inspection and optimization of individual boards 25. This procedure progresses as follows. A board 25 is inserted into the cabinet 11 until the rear edge of the board is aligned with x and y reference stops located in the punch assembly 36. Specifically, with reference to FIG. 2 the x reference stop is provided by the inner edge 121 of assembly 36, while the y reference step is provided by a pin 122 removably inserted into the appropriate one of a plurality of panel stop apertures 123 formed in the top guide 124 of assembly 36. Next, the clamps 31, 32 are activated, after which all service panels and access doors are closed and the x-ray imaging system is activated.

Upon activation of the x-ray imaging system, the four target areas A-D are examined, the image data for each target region is digitized and stored in unit 67, and examined and processed by the CPU 68 to determine the degree of mis-registration of the four target regions A-D and calculate new coordinates for each of the four target regions required to optimize the drilling position of the board.

Once the new coordinates for each of the target regions A-D have been determined, CPU 68 activates the x-y driving motors for panel clamps 31, 32 to reposition the board 25 at these new coordinates. Once the board has been thus repositioned to the optimum location, the punch assembly 36 is activated through controller 70 by CPU 68 to punch the three reference indicia holes 110-112 (FIG. 9) along the rear edge of the board 25. As seen in FIG. 9, the reference indicia holes may be circular (hole 110) or oblong (holes 111, 112), with the center hole 111 offset to provide correct panel orientation for the subsequent drilling operations. After the reference indicia holes have been so formed, the x-ray imaging system may be deactivated, and the board 25 removed for drilling.

The algorithm used for generating the reference coordinate position from the template 115 is as follows. After the template 115 has been inserted into the unit and clamped, and the high voltage and current settings are adjusted to give a high contrast between the regions inside of the target holes A'-D' and those outside the holes, an image is captured by time integration over several frame times. This image is digitized and stored in the 512×512 frame buffer incorporated into the frame store unit 67. For each pixel, a gray shade value from 0 (black) to 255 (white) is stored in the buffer. The stored image is then processed in the following manner.

For each quadrant containing a target hole, a cursor is manually moved to the approximate center of the corresponding target hole image. The program then examines pixels by moving the cursor to the left (negative x direction) until a pixel is found whose gray shade value is just less than a preset contour level. The program then generates a list of pixels that are just outside the preset contour level. The resulting contour should be a circle. The center of the circle is calculated by averaging the x values and averaging the y values of the pixels in the list.

The clamps 31, 32 are next successively moved a predetermined distance (0.02 inch) from the initial position as follows:
1. Both x stages in the positive x direction.
2. Both x stages in the negative x direction.
3. The left y stage in the positive y direction.

4. The left y stage in the negative y direction.
5. The right y stage in the positive y direction.
6. The right y stage in the negative y direction.

The hole centers for each of the six above settings are found in the same manner as those found for the first setting.

The program uses this information to generate a 3×8 transformation matrix capable of converting the desired eight x and y target movements for the four quadrants of a given PC board 25 to the three possible clamp stage movements (left y clamp stage, right y clamp stage and both x clamp stages moving together). This completes the template algorithm.

The printed circuit board algorithm proceeds as follows. A board 25 is inserted into the clamp assembly until the rear edge of the board abuts the x and y reference stops 121, 122. Clamps 31, 32 are then set and the board 25 is translated by moving the left and right x and y clamp stages away from the stops by a predetermined amount (0.25 inch). The board 25 is then locked in the clamped assembly by actuating a stripper bar portion of punch assembly 36. Next, the high voltage and current settings are adjusted to give a high image contrast between the regions inside the target areas A–D and those outside the target areas. An image is then captured by time integration over several frame times. This image is digitized and stored in the frame buffer. For each pixel a gray shade value from 0 (black) to 255 (white) is stored in the buffer. The stored image is then processed in the following manner.

FIG. 10 illustrates the simple case of a two layer board having misaligned target areas in each of the four quadrants of the board. For each quadrant, a cursor is moved to approximately the center of the union of the target areas from the two individual layers, shown in the Fig. as the region within the solid line. The image pixels corresponding to a given target area and the region immediately surrounding the target area (such as the upper left hand target area shown in FIG. 10) are then examined by moving the cursor to the left as viewed in FIG. 10 (the negative x direction) until a pixel is found whose gray shade value is just greater than a preset contour level. A list of pixels that are just outside the preset contour level is then generated. The resulting contour comprises a closed figure which surrounds the union of the target areas in a given quadrant. The best position for the hole to be drilled is that which maximizes the distance of the center of the hole to the nearest target area edge. It is noted that this is equivalent to minimizing the maximum distance between the hole center to the edge of the union of the target areas (line BC in FIG. 10). The best least squares position is then calculated such that the sum of the squares of the distances of all of the contour points in all four quadrants from the corresponding hole centers is minimized.

Some pixel to hole center distance (e.g., line AB in FIG. 10) will be longer than all the other pixel to hole center distances. A calculation is performed to determine how far to move along this vector (decreasing its length) until some other vector becomes equal in length (line CD in FIG. 10). A calculation is then made to determine how far to move along the bisector of these two vectors (decreasing their lengths equally) until a third vector becomes equal in length (line FG in FIG. 10) to the first two. FIG. 11 shows vectors AB and CD drawn so that points B and D coincide. The bisector direction is line EB.

FIG. 12 shows vectors AB, CD and FG drawn so that points B, D and G coincide. In this case, movement along the bisector of CD and FG (line BH in FIG. 12) will decrease vector CD and FG equally and vector AB by a greater amount. A calculation is now made to determine how far to move along BH until another vector (line KG in FIG. 10) is equal to vectors CD and FG. This step is repeated until the conditions illustrated in FIG. 13 are obtained. In this case, any translation of the board will produce an increase in the length of at least one of the three vectors. This condition is met when none of the three angles shown in FIG. 13 is greater than 180°.

A determination is now made to determine whether there is a point about which a rotation could decrease the lengths of the resulting three critical vectors. In FIG. 10, a rotation about the point L would decrease the length of the vectors CD, FG, and KG equally until vector MN is equal to these three.

At this point, the necessary translation and rotation required to minimize the maximum contour pixel to corresponding hole distance has been calculated. In general, at this solution there will be three or four vectors whose lengths are equal and longer than all other vectors. From the calculated amounts of desired translation and rotation, the 3×8 transformation matrix noted above is employed to calculate the required movements of the clamp stages, after which the stripper bar portion of the clamp assembly 36 is released and the clamp stages are directed to move the corresponding amounts.

The stripper bar is then reset and a second analysis is performed. If the board is within the required specifications (i.e., the maximum contour pixel-to-hole center is less than some preset maximum), the board is then punched. If not, a second movement can be made based on a second calculation. Alternatively, if no movement will relocate the board within specifications, the board is rejected. As noted above, the operator has the option of overriding the computer's decision to reject or punch. In addition, the computer keeps a record of all critical vectors and whether or not the board has been rejected or accepted. This record is periodically printed out as a report detailing the information for all boards processed.

As will now be apparent, the invention provides a highly effective method and apparatus for processing multi-layer printed circuit boards for acceptability prior to the automatic drilling process, which automatically determines the degree of mis-registration of individual board layers, calculates whether a board lies within the tolerance limits, and provides reference indicia on the board which specify to the follow-on automatic drilling machine the optimum position of that board for the drilling program to be executed. An important feature of the method lies in the fact that the template 115 used to provide the reference coordinates for the target areas A-D is preferably prepared on the same automatic drilling machine which is used to later drill those multi-layer boards which are found to be acceptable. By using this same automatic drilling machine to prepare the template, the drilling machine tolerances are automatically incorporated into the reference holes formed in the template 15, and these tolerances in turn are automatically incorporated into the board 25 inspection process. Thus, rather than using coordinate positions referenced to some external standard, the actual coordinate reference positions are referenced to the positions provided by the drilling machine itself. Consequently, any deviations in the drilling machine positioning apparatus from an absolute standard are carried through into the inspection process and are thus eliminated as a source of error. In addition, by repositioning each particular multi-layer board 25 with respect to the four target areas A-D, a best fit or optimum positioning of the board 25 is obtained which ensures that the lesser deviations normally encountered in the central region of the board are compensated for. Moreover, by enabling boards with unacceptable mis-registration to be separated out before being passed onto the drilling station, the invention enables substantial amounts of useless drilling time to be saved. Further, the invention is adaptable to a wide range of drill hole sizes, target region dimensions and tolerance limits, all of which can be individually entered by the operator during the initial setup procedure.

Another important aspect of the invention lies in the fact that, even with multi-layer boards which are unacceptable for the complete drilling process (due to mis-registration beyond the acceptable limit), in the case of multi-layer boards with repeated circuit patterns (e.g., a multiplicity of identical patterns repeated at predetermined intervals across the board) some portions of the board may be chosen by the operator to be usable (e.g., if a best fit cannot be obtained with all four target regions, but can be manually maneuvered through keyboard operation while under visual inspection by the operator to reposition, say, the target regions A and C in an acceptable configuration). In addition, by enabling data to be gathered on the individual boards, additional information is provided for quality control purposes (such as the number of rejected boards in a given run, the degree or amount of mis-registration of individual boards, etc.).

While the above provides a full and complete disclosure of the preferred embodiment of the invention, various modifications, alternate constructions and equivalence may be employed as desired. For example, other mechanical and electro-mechanical positioning arrangements may be employed for the source/detector pairs and panel clamps. Similarly, different reference indicia marking apparatus from punch assembly 36 may be employed, such as an edge notching apparatus, a die marker apparatus and the like. Therefore, the above description and illustrations should not be construed as limiting the scope of the invention, which is defined by the appended claims.

What is claimed is:

1. A method of preparing a multi-layer printed circuit board for automatic drilling in a drilling apparatus, said board comprising a laminated stack of individual boards each having a plurality of target areas located at predetermined locations thereon so that corresponding target areas on different individual boards overlap, said method comprising the steps of:
   (a) positioning said multi-layer board in an inspection fixture;
   (b) examining said target areas with a radiation source and a detector;
   (c) comparing the locations of said target areas with predetermined location coordinates; and
   (d) marking said multi-layer board with reference indicia providing optimum positioning for the multi-layer board in the drilling apparatus.

2. The method of claim 1 wherein said step (c) of comparing is performed with predetermined location coordinates obtained by centering a master template having said target areas in said inspection fixture and storing the location coordinates of said master template target areas.

3. The method of claim 1 wherein said step (d) of marking includes the step of forming apertures in preselected regions of said multi-layer board.

4. The method of claim 3 wherein said apertures are formed along one edge portion of said multi-layer board.

5. The method of claim 1 wherein said step (d) includes the step of calculating those orthogonal position coordinates for said multi-layer board which result in circumscription of a minimum drilling area by overlapping target areas.

6. A system for enabling the preparation of a multi-layer printed circuit board for automatic drilling in a drilling apparatus, said board comprising a laminated stack of individual boards each having a plurality of target areas located at predetermined locations thereof so that corresponding target areas on different individual boards overlap, said system comprising:
   positioning means for movably supporting a multi-layer board;
   means for examining the target areas of a multi-layer board when located on said positioning means;
   memory means for storing predetermined location coordinates;
   means for comparing the locations of said target areas with said predetermined location coordinates;
   means for enabling said positioning means to locate a multi-layer board in an optimum position wherein overlapping target areas circumscribe said predetermined location coordinates with a minimum drilling area; and
   means for marking a multi-layer board with reference indicia indicating said optimum position.

7. The invention of claim 6 wherein said marking means includes means for forming apertures in preselected regions of the multi-layer board.

8. The invention of claim 7 wherein said apertures are formed along one edge portion of said multi-layer board.

9. The invention of claim 6 wherein said enabling means includes means for calculating the amount of movement of the multi-layer board required to provide said optimum position.

10. The invention of claim 6 further including means for determining that a given multi-layer board cannot be located in said optimum position.

11. The invention of claim 6 wherein said examining means includes a radiation source and a plurality of radiation detectors.

12. The invention of claim 6 wherein said examining means includes a plurality of radiation sources and a corresponding plurality of radiation detectors.

13. The invention of claim 12 wherein said radiation sources are sources of x-radiation and said radiation detectors are x-radiation detectors.

* * * * *